(12) United States Patent
Igarashi et al.

(10) Patent No.: US 7,414,238 B2
(45) Date of Patent: Aug. 19, 2008

(54) OPTICAL ENCODER DEVICE FOR SMALL-SIZED MOTOR AND METHOD OF PRODUCING THE SAME

(75) Inventors: Kouhei Igarashi, Matsudo (JP); Toshihiro Kamiyoshihara, Matsudo (JP)

(73) Assignee: Mabuchi Motor Co., Ltd., Chiba (JP)

( * ) Notice: Subject to any disclaimer, the term of this patent is extended or adjusted under 35 U.S.C. 154(b) by 0 days.

(21) Appl. No.: 11/575,337

(22) PCT Filed: Sep. 26, 2005

(86) PCT No.: PCT/JP2005/017576

§ 371 (c)(1),
(2), (4) Date: Mar. 15, 2007

(87) PCT Pub. No.: WO2006/035686

PCT Pub. Date: Apr. 6, 2006

(65) Prior Publication Data

US 2008/0001106 A1  Jan. 3, 2008

(30) Foreign Application Priority Data

Sep. 28, 2004 (JP) ............................. 2004-281366
Sep. 22, 2005 (JP) ............................. 2005-275028

(51) Int. Cl.
*G01D 5/34* (2006.01)

(52) U.S. Cl. ................... 250/231.13; 356/616; 356/617; 341/13; 341/31; 33/1

(58) Field of Classification Search ................
250/231.13–231.18, 237 G, 237 R; 356/616–619; 341/11, 13, 31; 359/436–442, 566; 33/1 PT, 33/1 N; 310/68 R, 68 B, 68 C, 68 D, 68 E
See application file for complete search history.

(56) References Cited

U.S. PATENT DOCUMENTS 3,693,023 A * 9/1972 Wasserman ............ 250/231.16
3,894,232 A * 7/1975 Laspesa ................. 250/231.13

FOREIGN PATENT DOCUMENTS

| EP | 1 324 475   | 7/2003  |
|----|-------------|---------|
| JP | 63-185523   | 11/1988 |
| JP | 7-16566     | 3/1995  |
| JP | 53-143009   | 4/1998  |
| JP | 2002-357457 | 12/2002 |
| JP | 2003-014497 | 1/2003  |
| JP | 2003-199297 | 7/2003  |

* cited by examiner

*Primary Examiner*—Georgia Y. Epps
*Assistant Examiner*—Francis M Legasse, Jr.
(74) *Attorney, Agent, or Firm*—McGlew & Tuttle, P.C.

(57) ABSTRACT

An optical encoder device for a small-sized motor has a code wheel attached to a motor shaft which extends to the exterior of the motor through a bearing accommodated in a bearing-retaining section provided on an end bell of the motor, and a board on which a photosensor module is mounted such that an optical modulation track portion of the code wheel is positioned and disposed in a gap of the photosensor module. While a spacer is sandwiched between the end bell and the board, the motor, the spacer, and the board are fixed together by soldering a pair of motor terminals to a printed wiring portion of the board. The spacer has a generally U-shaped structure so as to allow fitting in position thereof from a direction orthogonal to the motor shaft.

7 Claims, 11 Drawing Sheets

CODE WHEEL

FLANGE PORTION

SLIT

PHOTOSENSOR MODULE

GAP

TERMINAL FOR CONNECTION WITH PRINTED WIRING

CONNECTOR

TERMINAL FOR EXTERNAL CONNECTION

TERMINAL FOR CONNECTION WITH PRINTED WIRING

FIG. 5

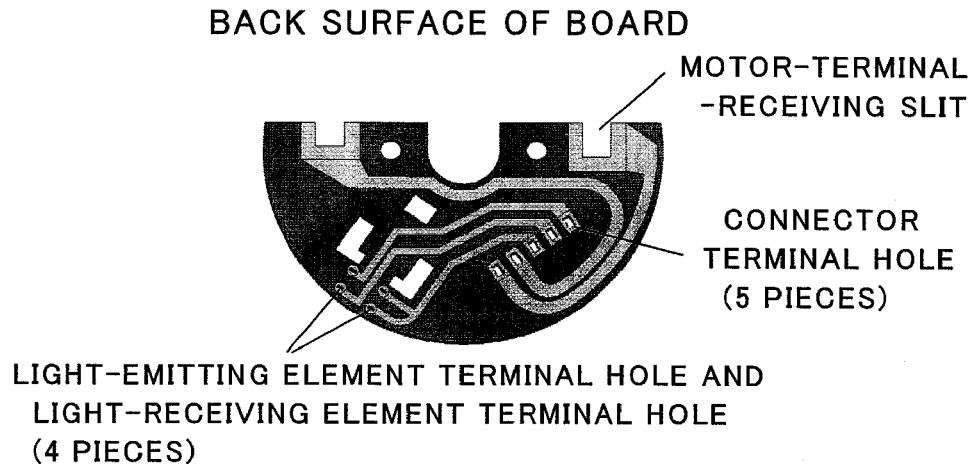

BACK SURFACE OF BOARD

MOTOR-TERMINAL-RECEIVING SLIT

CONNECTOR TERMINAL HOLE (5 PIECES)

LIGHT-EMITTING ELEMENT TERMINAL HOLE AND LIGHT-RECEIVING ELEMENT TERMINAL HOLE (4 PIECES)

FIG. 6(A)

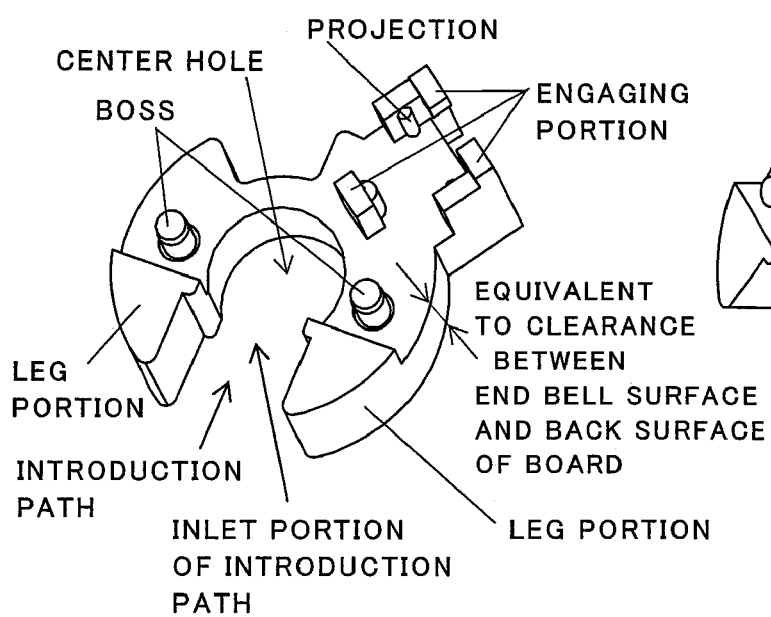

CENTER HOLE
BOSS
PROJECTION
ENGAGING PORTION
LEG PORTION
INTRODUCTION PATH
INLET PORTION OF INTRODUCTION PATH
EQUIVALENT TO CLEARANCE BETWEEN END BELL SURFACE AND BACK SURFACE OF BOARD
LEG PORTION

FIG. 6(B)

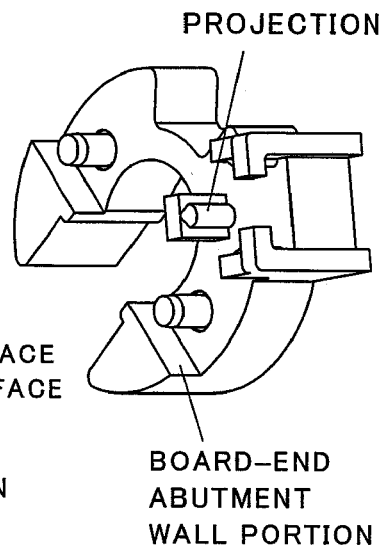

PROJECTION
BOARD-END ABUTMENT WALL PORTION

FIG. 6(C)

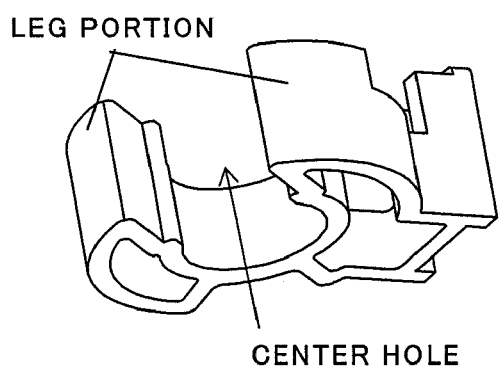

LEG PORTION
CENTER HOLE

FIG. 6(D)

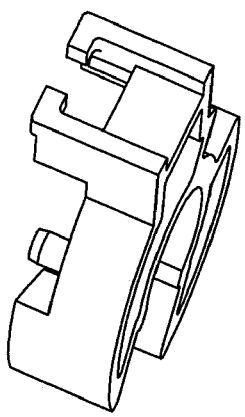

PHOTOSENSOR MODULE

U-SHAPED SPACER

Prior Art
FIG. 18(A)
Prior Art
FIG. 18(B)
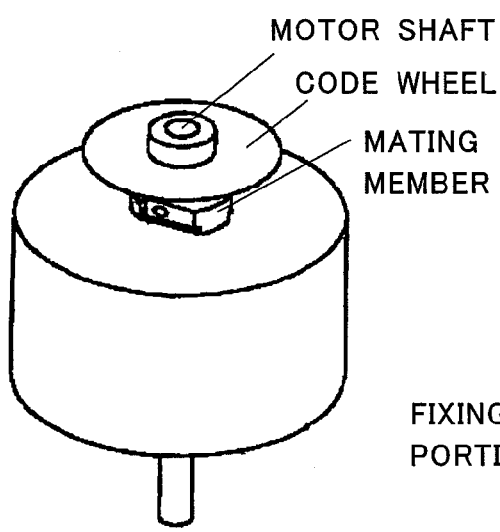
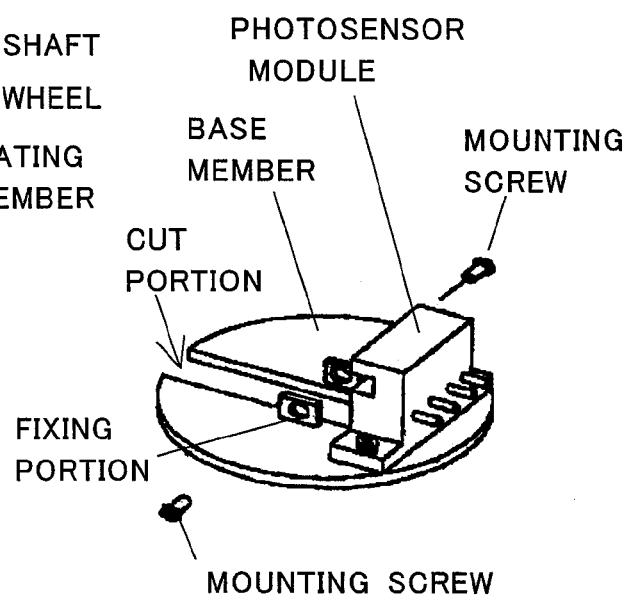
Prior Art
FIG. 18(C)
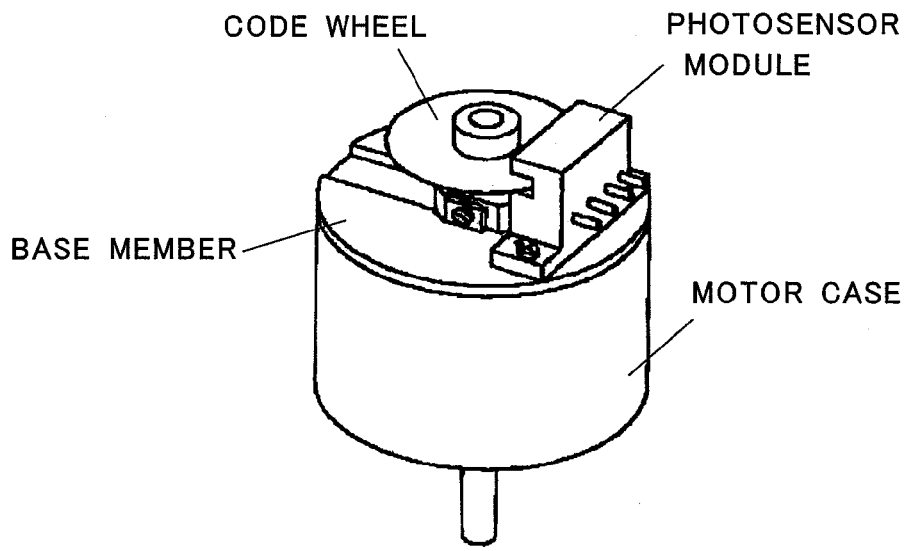

US 7,414,238 B2

OPTICAL ENCODER DEVICE FOR SMALL-SIZED MOTOR AND METHOD OF PRODUCING THE SAME

TECHNICAL FIELD

The present invention relates to an optical encoder device for a small-sized motor in which a code wheel attached to a motor shaft is positioned and disposed in a gap of a photosensor module and which optically detects the rotation of the motor shaft, as well as to a method of producing the same.

BACKGROUND ART

There is demand for attaching, to a small-sized motor, a device for detecting the rotational speed and position of the motor. Known detecting devices of this kind perform magnetic detection by use of a magnet and a Hall element, mechanically turn on/off electrical continuity between two brushes, or perform optical detection by use of a photodiode (light-emitting element) and a phototransistor (light-receiving element). The present invention relates to this optical encoder device. A small-sized motor having such an optical encoder device can be used in OA apparatus which requires rotational control, such as a printer.

FIG. 18 shows a first prior art technique for attaching an optical encoder to a motor (refer to Patent Document 1). FIG. 18(A) shows a small-sized motor in which a code wheel is attached to a motor shaft; (B) shows a base member on which a photosensor module is mounted; and (C) shows a state in which the small-sized motor and the photosensor module are assembled together. In the assembled state shown in (C), the code wheel having an optical modulation track is disposed in a gap of the photosensor module configured such that a light-emitting element and a light-receiving element face each other, so as to obtain a signal associated with the rotation of a motor shaft.

As shown in (A), in order to dispose the code wheel so as to pass through the gap in the photosensor module, first, the code wheel is attached to an end portion of the motor shaft. Subsequently, as shown in (B), the base member on which the photosensor module is mounted is fixedly fitted in position from a direction orthogonal to the motor shaft such that a cut portion thereof is fitted to a mating member. Thus, the mating member is fixed to a motor case in such a manner that the motor shaft extends therethrough; the cut portion of the base member has fixing portions at respective opposite sides thereof, and the mating member and the fixing portions are fixed together in position by use of mounting screws.

The illustrated configuration allows fitting of the base member from a direction orthogonal to the motor shaft for positioning and fixing of the base member. Thus, the photosensor module can be fixedly attached at a predetermined position without damage to the code wheel, which could otherwise result from contact between the photosensor module and the code wheel during attachment.

However, since the mating member must be fixed to the motor case, the motor case must have a special shape such that its end face to which the mating member is attached is, for example, flat. Thus, the mating member cannot be attached to a standard motor. In a standard motor, the end face of the motor case not only is unflat but also has irregularities and components such as a bearing-retaining section and motor terminals. The first prior art technique does not consider attachment to a standard motor and is thus not practical.

Additionally, the first prior art technique requires use of screws or the like for ensuring fixation to a motor, resulting in an increase in cost.

FIG. 19 shows a second prior art technique for attaching an optical encoder to a motor. (A) is a perspective view of a small-sized motor to which the optical encoder is attached. (B) shows a sensor unit configured such that a connector and a photosensor module are disposed on a board. After motor terminals are fitted into respective motor terminal insertion slits formed in the illustrated board of the sensor unit, the motor terminals are soldered to the board from the front side of the board (a side of the board opposed to a motor end bell is called the "back side," and the opposite side is called the "front side"), whereby the board is fixed. This eliminates the need to attach a special mating member to the motor as in the case of the prior art technique shown in FIG. 18 and enables attachment of the optical encoder to a standard motor.

However, since the board of the sensor unit is fixed to the motor merely by soldering to motor terminal portions of the motor, the board is suspended off the motor end bell. FIG. 17 shows this suspended state. If an external force is exerted on an edge portion of the suspended board, the board may bend and be broken. In order to avoid this problem, a glass-epoxy board, which exhibits high strength, must be used. This leads to an increase in cost.

Such an external force may possibly cause bending (plastic deformation) of the motor terminals. If the motor terminals are bent, the positional relationship between the code wheel and the photosensor changes, resulting in a failure to accurately detect a signal. In order to cope with this problem; i.e., in order to make the motor terminals less likely to bend upon imposition of an external force thereon, the distance between a portion (fulcrum) of the motor terminal which is fixed to the motor end bell, and a portion (point of application) of the motor terminal which is attached to the board must be shortened. This narrows the clearance between the board and the motor end bell, resulting in a failure to provide a sufficient working space for soldering the board to the motor terminal portions from the back side of the board. Thus, connection by soldering between the motor terminal portions and a printed wiring portion of the board must be performed at the front side of the board. As in the case of ordinary electronic components, terminals of the photosensor unit and those of the connector extend through respective terminal holes formed in the board and are fixedly soldered to the back side of the board. By contrast, as mentioned above, the motor terminal portions must be fixedly soldered to the front side of the board. Thus, the board must be a double-sided, printed wiring board, whose opposite sides have respective printed wiring portions, and thus becomes expensive. Also, since the motor terminals and the board are connected together by soldering at the front side of the board; i.e., on a side where the photosensor module is present, solder particles and flux may possibly scatter and adhere to the photosensor, causing malfunction of the photosensor.

Since the position (relative position) of the photosensor module in relation to the code wheel is visually determined, positioning of the photosensor is not consistent. Also, parallelism between the motor end bell surface and the board becomes difficult to establish, resulting in inconsistent sensor output.

FIG. 20 is a perspective view showing a third prior art technique for attaching an optical encoder to a motor. (A) and (B) show the same motor as viewed from different directions. The photosensor module and the motor terminals are connected to a printed wiring board and are led to a single region via traces on the board. Input to and output from the photosensor module and the motor terminals are made through the connector. If the printed wiring board assumes such a semicircular shape as shown in FIG. 19, the board will be raised from the motor end bell upon subjection to an external force directed in the direction of the arrow shown in FIG. 20(B). Thus, two leg portions of the U-shaped board are extended to the greatest possible extent so as prevent separation of the board from the motor end surface. However, since the cost of a printed wiring board depends greatly on the number of the printed wiring boards cut out from a single parent board of a predetermined size, such an expansion of surface area leads to an increase in cost.

Also, in the illustrated printed wiring board, a solder side for elements such as the photosensor module is opposite a solder side for the motor terminals. Thus, the printed wiring board must be a double-sided, printed wiring board and thus becomes expensive. By use of surface-mountable elements, the printed wiring board can be a single-sided, printed wiring board. However, the surface-mountable elements must have such heat resistance as to endure reflow soldering and thus are very expensive.

Since the terminals of elements such as the photosensor module cannot be arranged in a region where the board and the motor end bell overlap, the terminals are arranged radially outside of the motor as shown in FIG. 20(B). Accordingly, the board increases in size and thus becomes expensive. Also, since the board radially projects a great distance from the motor, the motor requires a large installation space in the interior of apparatus, such as a printer, in which the motor is installed.

Patent Document 1: Japanese Patent Application Laid-Open (kokai) No. 2002-357457

DISCLOSURE OF THE INVENTION

Problems to be Solved by the Invention

An object of the present invention is to solve the above problems, to enable fixation of a board of a sensor unit to a motor only at terminal portions of the motor, to eliminate need to attach a special mating member to the motor, and to enable attachment of the board to a standard motor.

Another object of the present invention is to employ such a configuration as to avoid stress concentration on the board or the motor terminals, which could otherwise be induced by an external force, so as to eliminate need to use an expensive component.

A further object of the present invention is to enable soldering to the terminal portions of the motor from the back side of the board by means of provision of a sufficient clearance between the board of the sensor unit and the motor end bell, so as to enable use of a single-sided, printed wiring board, which is inexpensive, and to prevent malfunction of the photosensor, which could otherwise result from scattering and adhesion of solder particles and flux to the photosensor during soldering.

Still another object of the present invention is to ensure positioning of a photosensor module in relation to a code wheel so as to avoid inconsistent photosensor output.

Means for Solving the Problems

An optical encoder device for a small-sized motor of the present invention has a code wheel attached to a motor shaft which extends to the exterior of the motor through a bearing accommodated in a bearing-retaining section provided on an end bell of the motor, and a board on which a photosensor module is mounted such that an optical modulation track portion of the code wheel is positioned and disposed in a gap of the photosensor module. While a spacer is sandwiched between the end bell and the board on which the photosensor module is mounted, the motor, the spacer, and the board are fixed together by soldering a pair of motor terminals to a printed wiring portion of the board. The spacer has a generally U-shaped structure having a center hole for positioning the bearing-retaining section, and an introduction path continuous to the center hole, so as to allow fitting in position thereof through the introduction path from a direction orthogonal to the motor shaft.

A method of producing an optical encoder device for a small-sized motor comprises integrally assembling a spacer and the board carrying the photosensor module so as to form a sensor unit, the spacer having a generally U-shaped structure having a center hole for positioning the bearing-retaining section, and an introduction path continuous to the center hole, so as to allow fitting in position of the spacer through the introduction path from a direction orthogonal to the motor shaft; fitting in position the sensor unit to the motor equipped with the code wheel from a direction orthogonal to the motor shaft; and fixing the motor, the spacer, and the board together by soldering a pair of motor terminals to a printed wiring portion of the board.

Effect of the Invention

According to the present invention, the U-shaped spacer rigidifies the sensor unit, thereby eliminating concern about strength against an external force. Also, the spacer complements the strength of the board. Thus, a thin, inexpensive board can be used. By virtue of the spacer, the sensor unit can be fixed to the motor without dependence on the strength of the motor terminals. This affords sufficiently wide space between the board and the motor for soldering, thereby enabling use of a single-sided, printed wiring board, which is inexpensive.

According to the present invention, use of the U-shaped spacer eliminates need to use additional components such as screws in fixing the sensor unit to the motor, whereby the sensor unit can be attached to a standard motor through fitting in position from a direction orthogonal to the motor shaft.

According to the present invention, the spacer eliminates concern about stress concentration on the motor terminals. Also, soldering can be performed in a shielded space between the board and the motor end bell, thereby preventing a problem caused by scattering of solder.

According to the present invention, a single component of the spacer enables positioning of the sensor unit in relation to the motor and positioning of the photosensor, thereby making sensor output consistent.

BRIEF DESCRIPTION OF THE DRAWINGS

FIG. 5 is a view showing a printed wiring portion on the back side of a board.

FIG. 6 is a series of perspective views showing the same spacer as viewed from different directions.

FIG. 18 is a series of views showing a first prior art technique for attaching an optical encoder to a motor.

BEST MODE FOR CARRYING OUT THE INVENTION

Figure 1A:
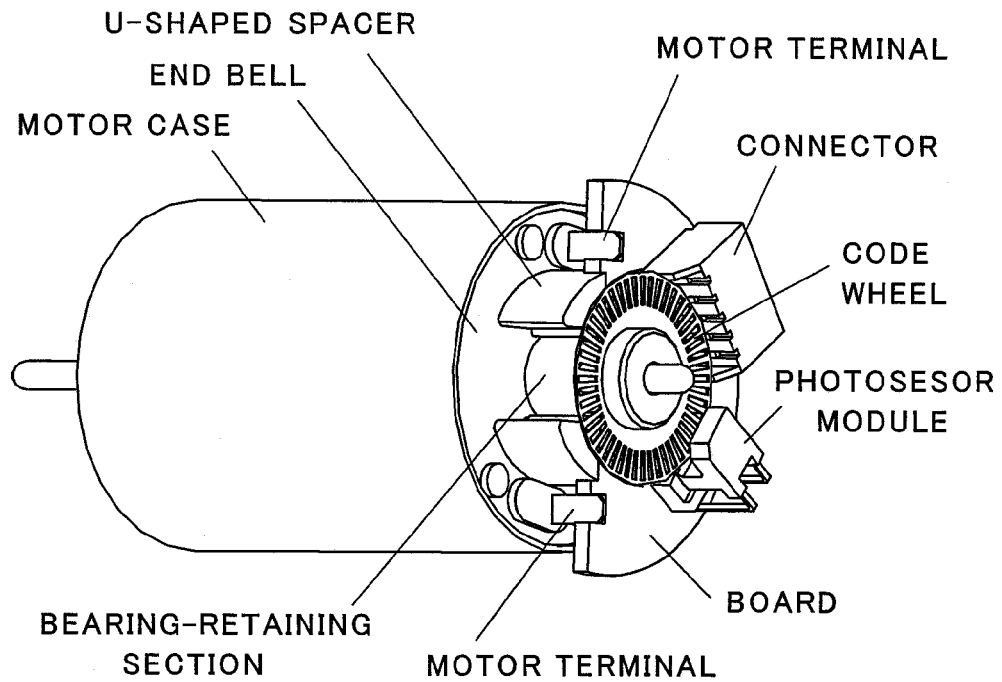
FIG. 1 is a pair of perspective views showing the overall configuration of a motor to which a sensor unit is attached, wherein (A) and (B) show the same small-sized motor as viewed from different directions.
Figure 1B:
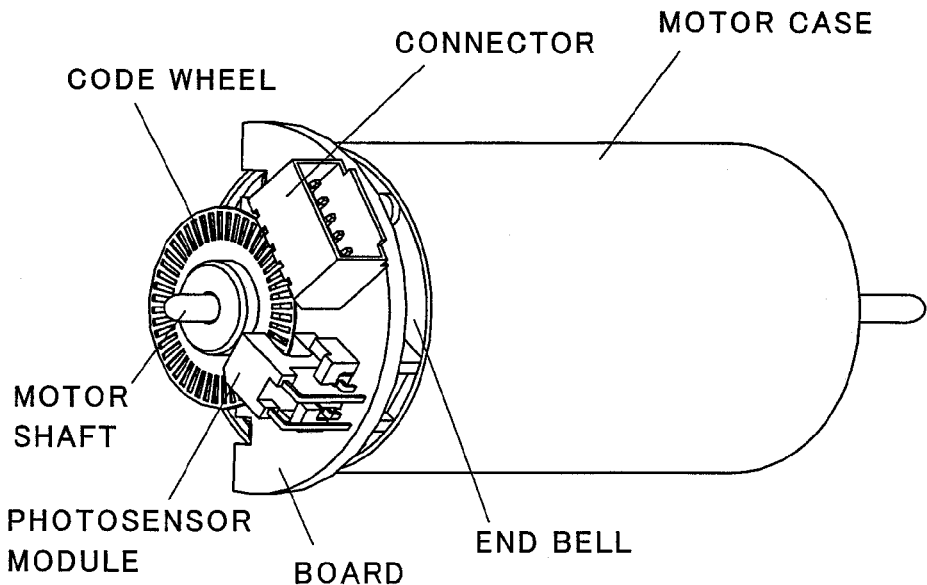

Embodiments of the present invention will next be described. FIG. 1 is a perspective view showing the overall configuration of a motor to which a sensor unit is attached, wherein (A) and (B) show the same small-sized motor as viewed from different directions. Although unillustrated, in the interior of a motor case, magnets which serve as magnetic poles on the stator side is installed, and a rotor is rotatably installed on a motor shaft. The rotor is configured such that a commutator and magnetic poles on the rotor side composed of a laminated core and windings are assembled together. After the rotor installed on the motor shaft is inserted into a closed-bottomed, hollow, cylindrical motor case through an opening of the motor case, an end bell is fitted to the motor case so as to close the opening of the motor case. A pair of brushes in contact with the commutator is connected to a pair of respective motor terminals, which extends to the exterior of the end bell. Current which is applied from an external power source to the motor via the brushes and the commutator flows to the windings of the magnetic poles of the rotor, thereby causing the motor to rotate. Such a small-sized motor itself has an ordinary configuration.

Figure 2:
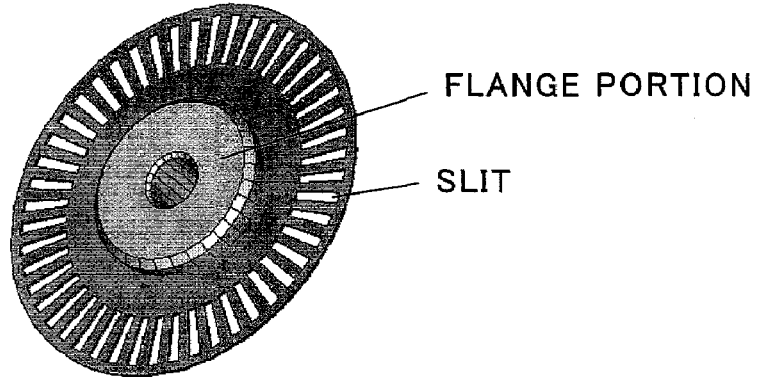
FIG. 2 is a view showing a code wheel.

The motor shaft is supported by a bearing located at the center of a bottom portion of the motor case and a bearing located at the center of the end bell. The bearing located on the end bell is accommodated in a bearing-retaining section formed integrally with the end bell. A code wheel is fixed in position, by press fit or the like, on an extended portion of the motor shaft which extends to the exterior of the end bell through the bearing on the end bell side. In the case where press fit is employed, a central flange portion of the code wheel is desirably of resin. In view of strength, the flange portion may be of iron, brass, or aluminum. The code wheel itself is an ordinary one. As shown in FIG. 2, the code wheel has an optical modulation track in which a plurality of slits are provided at circumferentially equal intervals. As the motor shaft rotates, the code wheel provides, for example, a signal of approximately 50 pulses/revolution. Light is emitted from one side of the code wheel and received on the other side of the code wheel. Light to be received is shut off and allowed to pass by slit portions and non-slit portions of the rotating code wheel, whereby rotational speed and position can be detected.

Figure 3:
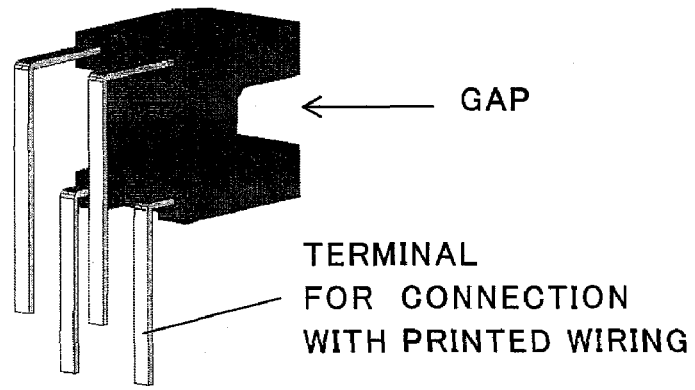
FIG. 3 is a view showing the exterior of a photosensor module.

The photosensor module has the exterior shown in FIG. 3 and is configured such that a light-emitting element and a light-receiving element face each other. While a spacer is sandwiched between a board and the end bell, a pair of motor terminals is soldered to the board on which the photosensor module is fixed, at a printed wiring portion on the back side of the board (on a side toward the end bell) such that the optical modulation track portion of the code wheel is disposed in position so as to pass through a gap in the photosensor module. In this manner, the motor, the spacer, and the board are fixed together.

Figure 4:
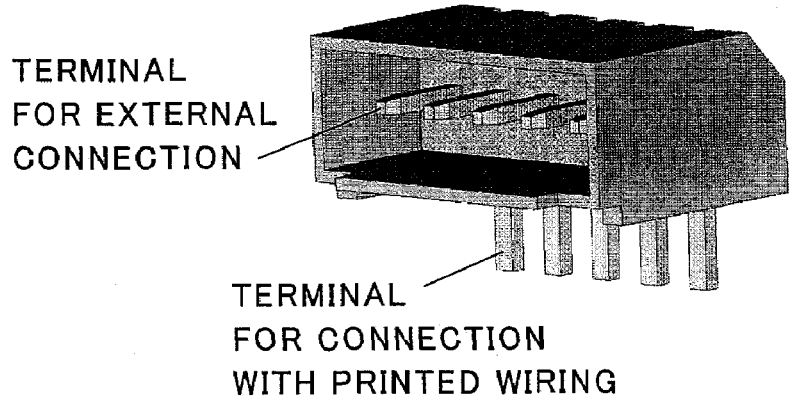
FIG. 4 is a view showing the exterior of a connector.

A single connector is disposed on the board. FIG. 4 shows the exterior of the connector. The connector has terminals for external connection through which power is externally supplied to the motor and the photosensor module and through which an encoder output signal is output, and terminals for connection with printed wiring which are electrically connected to a printed wiring portion of the board. FIG. 5 shows the printed wiring portion on the back side of the board. The printed wiring portion on the back side of the board provides traces extending between the connector and the motor terminals and traces extending between the connector and the photosensor module. Connector terminals consist of a pair of terminals for supplying power to the paired motor terminals, a pair of terminals for supplying power to the light-emitting element, and a pair of terminals for outputting a signal from the light-receiving element (one of the paired terminals can be used in common as one of the paired terminals for supplying power to the light-emitting element).

Figure 7:
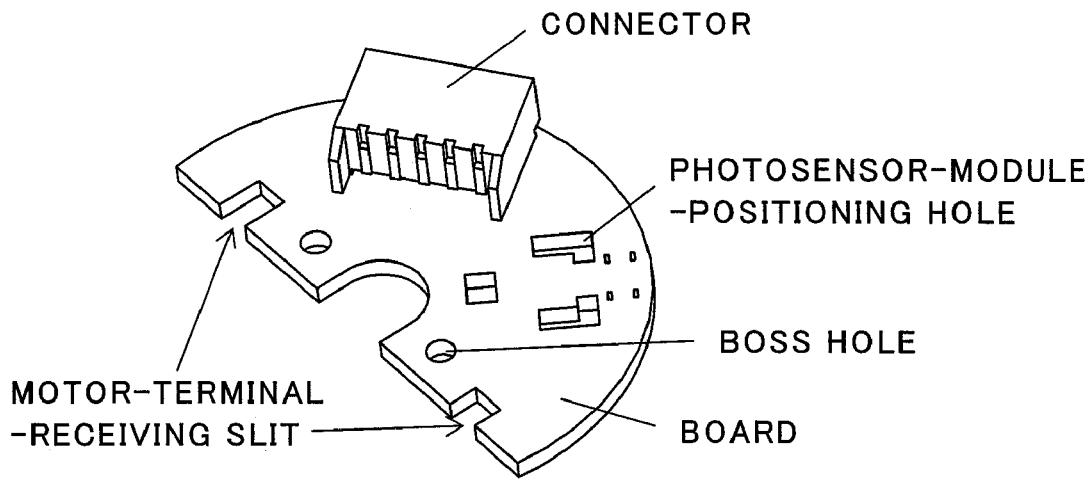
FIG. 7 is a view showing a state in which terminals of the connector for connection with printed wiring are inserted into the board from the front side of the board.

Next, assembling of the sensor unit and attachment of the sensor unit to the motor will be described with reference to detailed drawings of components and assembling process drawings. In assembling of the sensor unit, as shown in FIG. 7, first, the connector terminals are inserted into the board from the front side of the board and are soldered to the printed wiring portion on the back side of the board. Next, the spacer is attached to the board from the back side of the board. The spacer can be made of resin, which is inexpensive. The spacer has a generally U-shaped structure so as to allow fitting in position thereof from a direction orthogonal to the motor shaft; for example, the exterior as shown in FIG. 6. The U-shaped structure means a structure formed by cutting out a portion from an annular structure as viewed in plane from the axial direction of the motor shaft (as viewed in plane from the front side or the back side thereof) so as to form an introduction path continuous with the center hole. As shown in FIG. 6(A), portions of the U-shaped structure which are located on opposite sides, respectively, of the introduction path are called leg portions.

FIGS. 6(A) to 6(D) are perspective views of the same spacer as viewed from different directions, wherein (A) and (B) are views viewed from the front side (a side toward the board), and (C) and (D) are views viewed from the back side (a side toward the motor end bell). The exterior of the spacer as viewed from the axial direction of the motor shaft (as viewed from the front side or the back side) is determined so as to not interfere with soldering portions of terminals of elements mounted on the board and soldering portions of the paired motor terminals. Three engaging portions of the spacer for positioning the photosensor module extend through corresponding holes (photosensor-module-positioning holes shown in FIG. 7) formed in the board and are engaged with the photosensor module mounted on the front side of the board. The spacer has the center hole which is lightly fitted to the bearing-retaining section of the motor for positioning the same, the introduction path continuous with the center hole, and the leg portions located on opposite sides, respectively, of the introduction path. An inlet portion to the center hole of the introduction path is made slightly narrower than the outside diameter of the bearing-retaining section. By virtue of this feature, when a motor-assembling worker fits the spacer to the bearing-retaining section from a direction orthogonal to the motor shaft by utilization of elasticity of the generally U-shaped spacer, the worker can recognize from snapping sound and the tactile sense of his/her hand that the bearing-retaining section is completely fitted into the center hole of the spacer. Board-end abutment wall portions are provided on the front side of the spacer and are useful for positioning an end portion of the board. Two bosses have such a length as to extend through corresponding holes (boss holes shown in FIG. 7) formed in the board.

Figure 8:
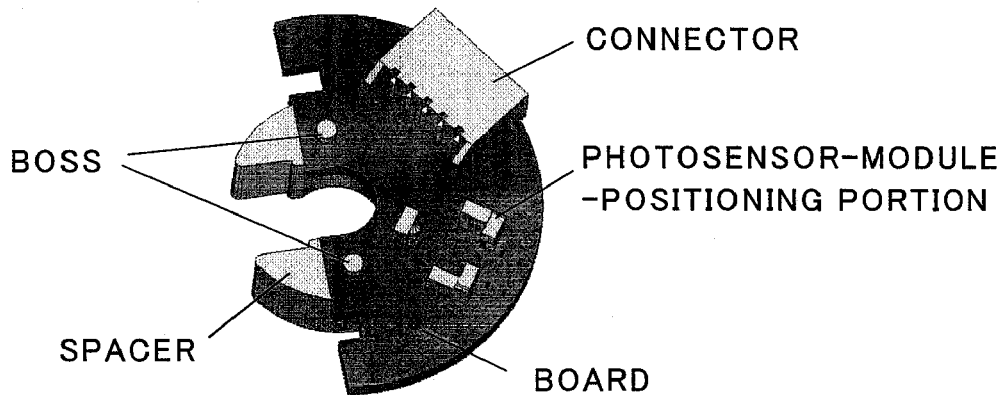
FIG. 8 is a view showing a state in which a spacer is fitted to the board from the back side of the board.

The bosses (two pieces illustrated) and sensor-module-engaging portions (three pieces) of the U-shaped spacer are inserted into corresponding boss holes and photosensor-module-positioning holes formed in the board from the back side of the board as shown in FIG. 8. In this work, an end of the board abuts the board-end abutment wall portions of the spacer. Subsequently, ends of the bosses are crushed (heat-staked) so as to fix the spacer to the board. In view of strength and working man-hours, boss hot-staking is a desired method for uniting the spacer and the board. However, boding or press fit can also be used for uniting. The thickness of the spacer maintains a predetermined clearance between the motor end bell surface and the back surface of the board. The shape of the spacer is such that, while the spacer and the board are united, the spacer does not come into contact with terminal portions of elements (the connector, the photosensor module, etc.) mounted on the board and terminal portions of the motor.

Figure 9:
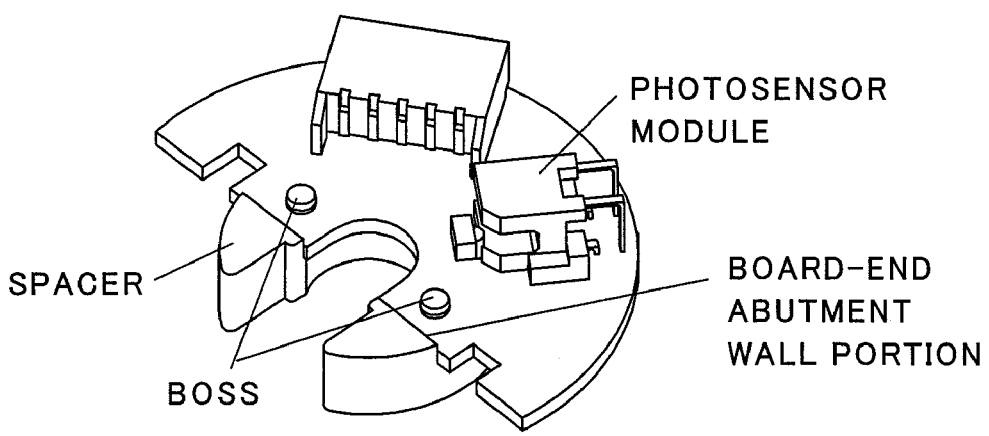
FIG. 9 is a view showing a state in which the assembly of a sensor unit is completed.
Figure 10:
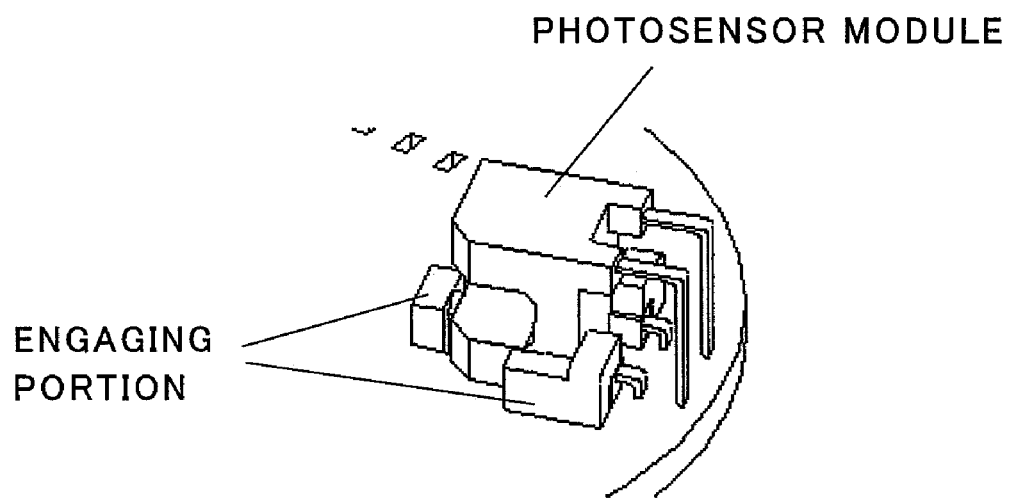
FIG. 10 is a view showing, on an enlarged scale, engaging portions engaged with the photosensor module.

FIG. 9 shows a state in which the sensor unit is completely assembled. FIG. 10 shows, on an enlarged scale, the photosensor-module-engaging portions of the spacer. As illustrated, the photosensor module is mounted while being positioned by the photosensor-module-engaging portions of the spacer. In this case, the photosensor module and the board surface in contact with the photosensor module can be fixed together by use of adhesive. In fixedly attaching the photosensor to positioning portions of the spacer, in order to ensure the accuracy and strength of attachment, the photosensor module is lightly press-fitted to the engaging portions, and the attachment is reinforced by bonding. In order to improve the positioning accuracy for this press fit, a projection can be provided on the press-fit contact surface of each engaging portion (see FIG. 6). Alternatively, in addition to the illustrated three photosensor-module-engaging portions, a hook-like latch nail (not shown) may be provided integrally with the spacer so as to fix the photosensor module by its elastic force. In this case, bonding becomes unnecessary.

Figure 11:
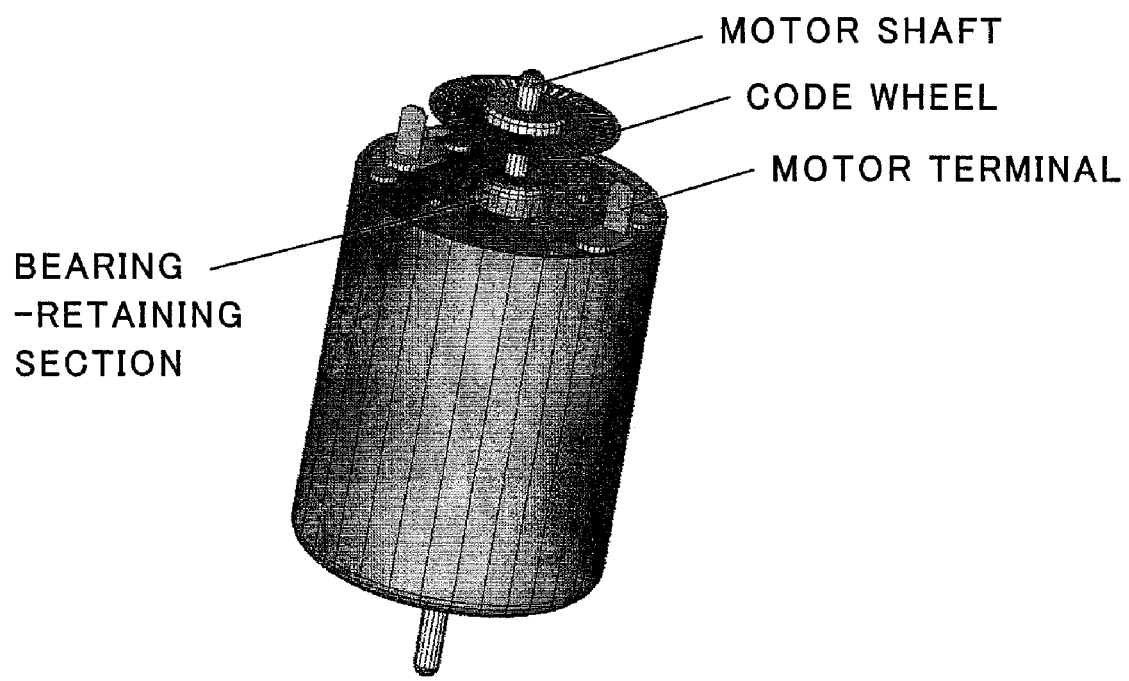
FIG. 11 is a view showing a motor in which the code wheel is positioned and fixed on a motor shaft.

FIG. 11 shows a state in which the code wheel is positioned and fixed on the motor shaft. The sensor unit shown in FIG. 9 is fitted, in position, to this motor from a direction orthogonal to the motor shaft such that the code wheel is positioned so as to pass through a gap in the photosensor module. The sensor unit is positioned appropriately by means of the bearing-retaining section of the motor being fitted into the center hole of the spacer of the sensor unit, and the paired motor terminals being fitted into corresponding slits (motor-terminal-receiving slits) formed in the board. Since a single component of the spacer has a bearing-retaining-section-positioning portion (center hole) and the photosensor-positioning portions (engaging portions), the photosensor can be accurately positioned in relation to the code wheel. Subsequently, the motor terminals and the printed wiring portion of the board are soldered from the back side (a side toward the end bell) of the board, thereby being electrically connected to each other and fixing the motor and the sensor unit together. Since the spacer and the board can be united through boss hot-staking, the sensor unit can be produced off-line, and the sensor unit can be snap-attached to the motor from the side of the motor. Since the spacer complements the strength of the board, the sensor unit can be applied to a motor of standard specifications without need to modify motor terminals, regardless of the size, position, and strength of the motor terminals.

Figure 16:
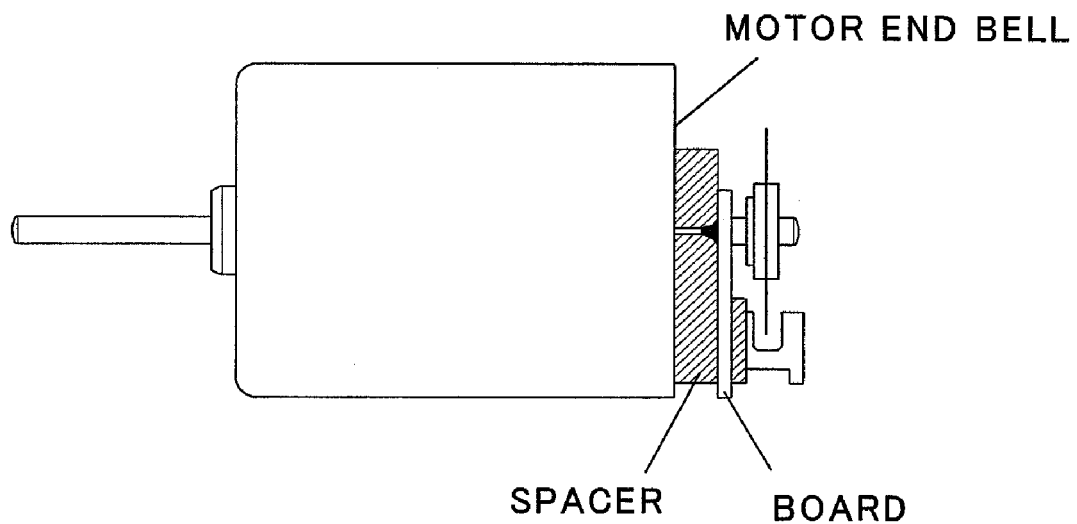
FIG. 16 is a view for explaining the action of the spacer.
Figure 17:
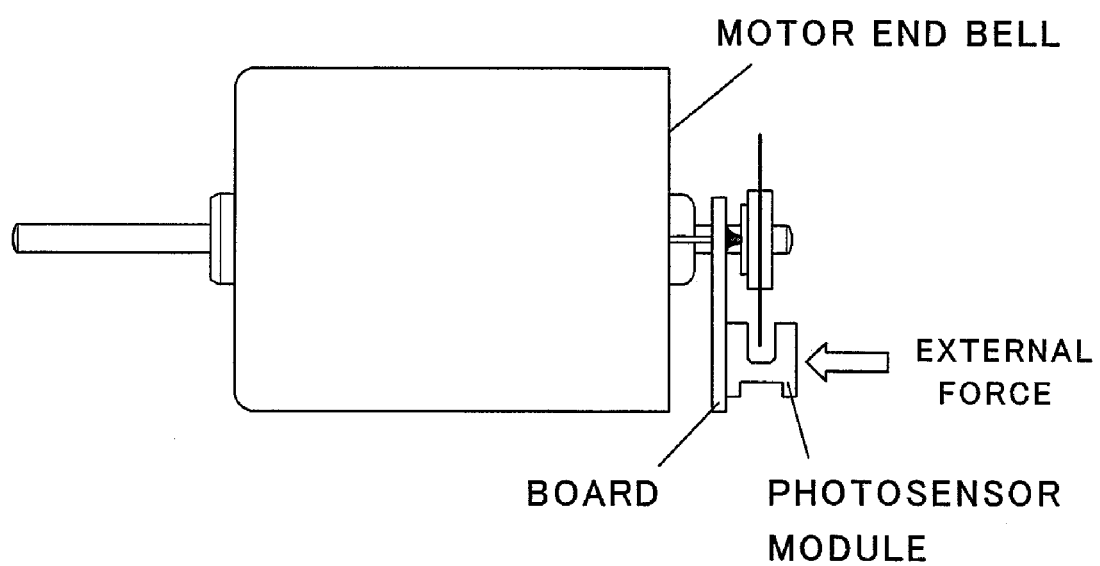
FIG. 17 is a view for explaining a problem involved in a prior art technique shown in FIG. 19.
Figure 19A:
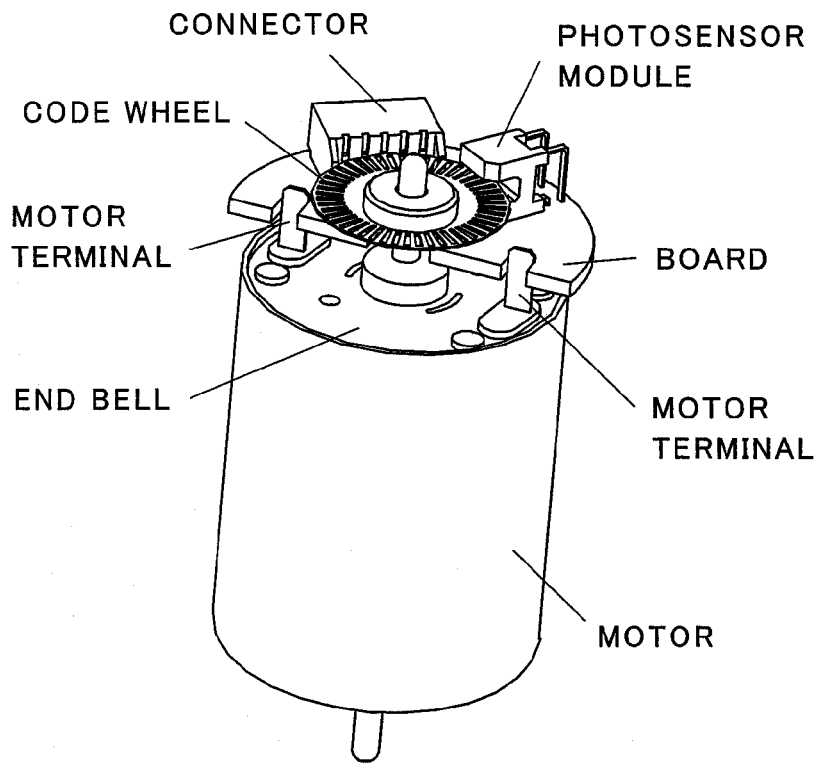
FIG. 19 is a pair of views showing a second prior art technique for attaching an optical encoder to a motor.
Figure 19B:
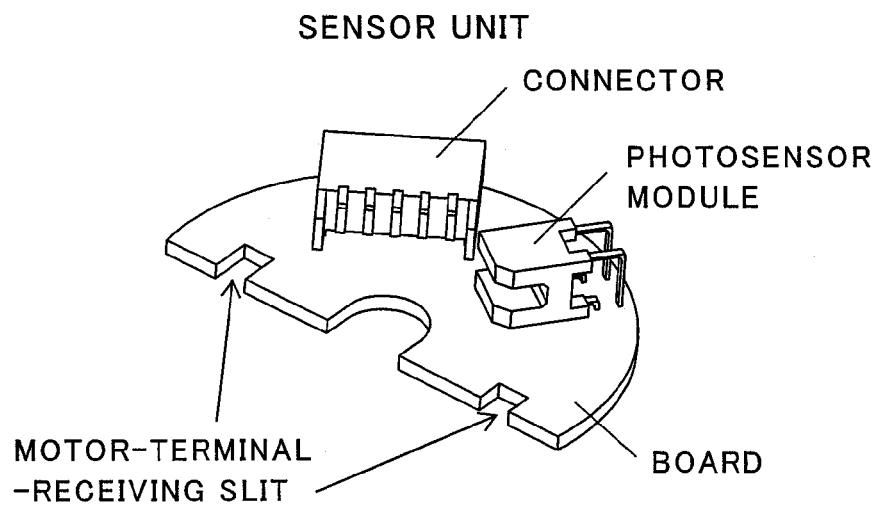
Figure 20A:
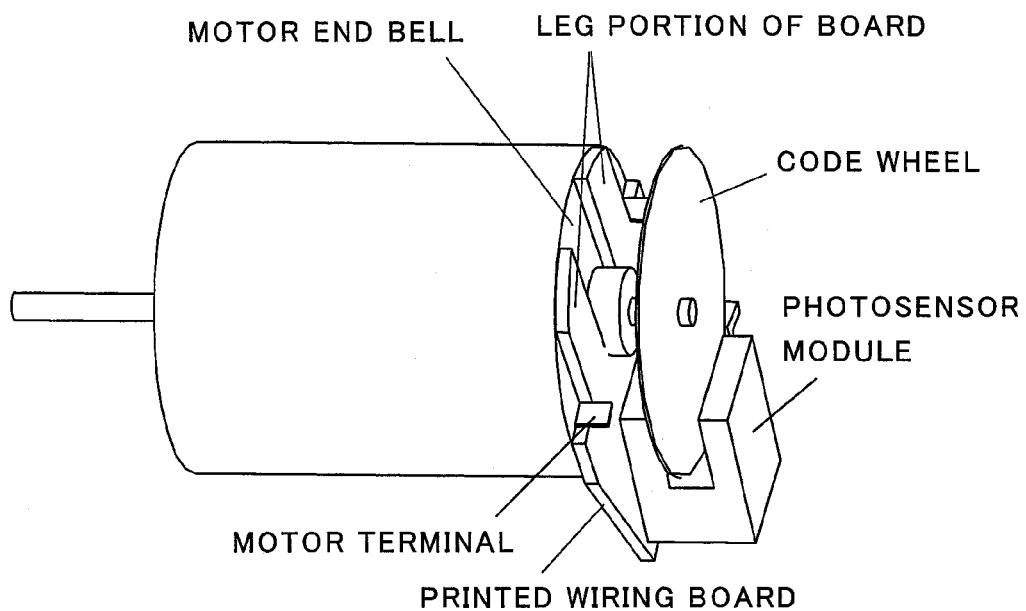
FIG. 20 is a pair of views showing a third prior art technique for attaching an optical encoder to a motor.
Figure 20B:
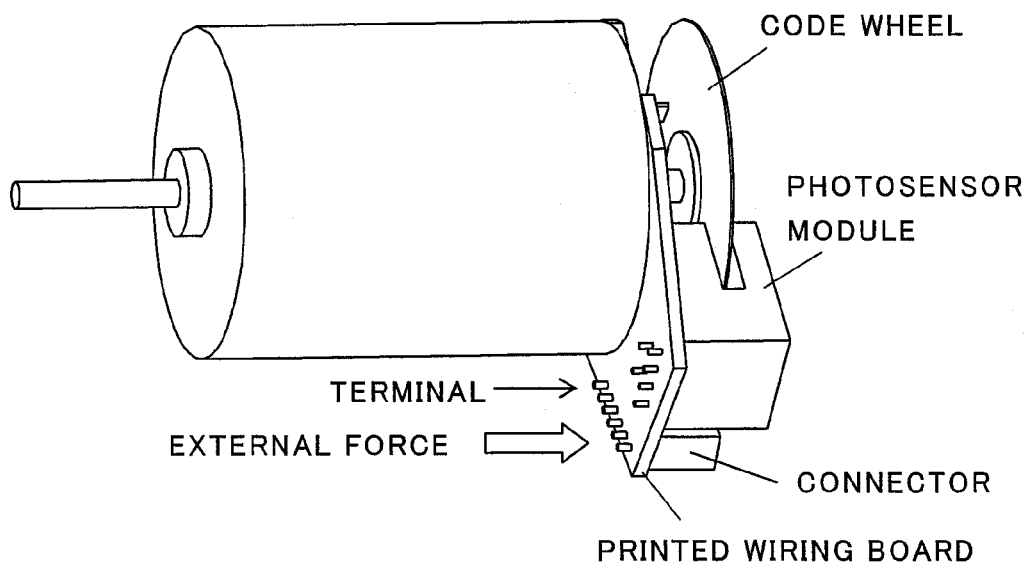

As mentioned above, by use of the U-shaped spacer, the code wheel and the photosensor, which constitute an optical encoder, can be attached to the exterior of a standard motor. As shown in FIG. 16, the spacer which is positioned between the motor end bell and the board is used as a base for the board, thereby complementing the strength of the board and thus improving reliability against an external force. This enables the use of a thin, inexpensive board; for example, a single-sided, copper clad phenol board. Using the spacer as a base for the board stabilizes the mounting parallelism of the board. The spacer covers brush-spreading holes (holes for allowing insertion of a jig therethrough for spreading the brushes so as to position the brushes on the commutator in assembling the motor) formed in the motor end bell surface, thereby preventing malfunction of the photosensor which could otherwise result from scattering and adhesion of brush wear particles to the photosensor. Also, the spacer forms a constant space between the motor end bell and the board, thereby enabling soldering of the motor terminals to the board in a closed space. Soldering the motor terminals and the board on the same side as soldering the connector and the photosensor to the board enables the use of a single-sided, printed wiring board, which is inexpensive. Also, since soldering is performed in a shielded space which is formed by use of the spacer, scattering and adhesion of solder to the photosensor and the code wheel can be prevented.

Figure 12A:
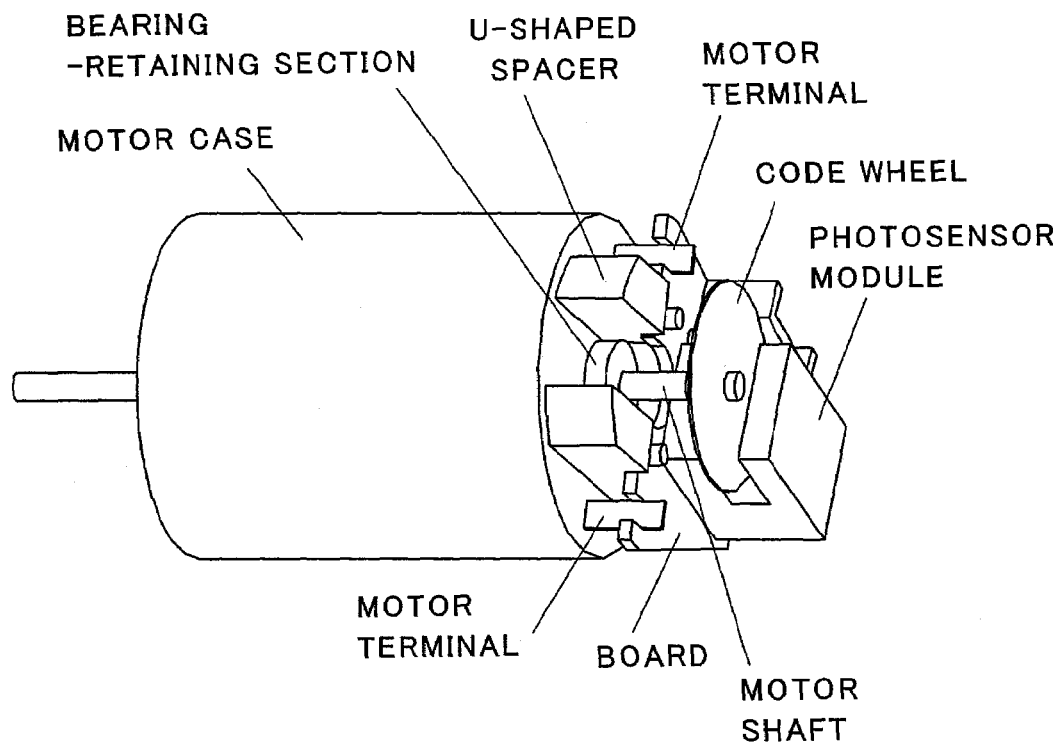
FIG. 12 is a pair of perspective views showing the overall configuration of a motor to which a sensor unit different from that of FIG. 1 is attached, wherein (A) and (B) show the same small-sized motor as viewed from different directions.

FIG. 12 is a pair of perspective views showing the overall configuration of a motor to which a sensor unit different from that of FIG. 1 is attached, wherein (A) and (B) show the same small-sized motor as viewed from different directions. The illustrated photosensor module has bosses for mounting and positioning, which will be described later. Therefore, the motor differs from the motor shown in FIG. 1 in the structure of the board on which the photosensor module is fixed and in the shape of the U-shaped spacer located on the back side of the board, and is similar in other structural features to the motor of FIG. 1.

Figure 13:
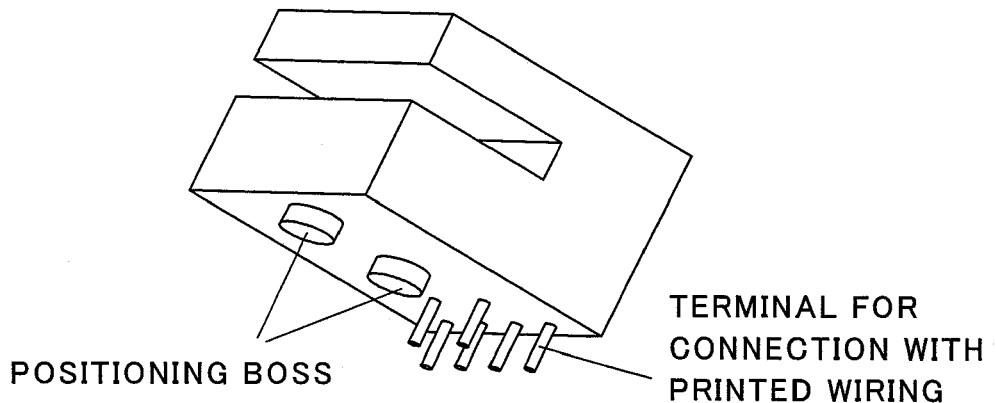
FIG. 13 is a view showing the exterior of a photosensor module different from that of FIG. 3.

The photosensor module has the exterior shown in FIG. 13. As in the case of the photosensor module which has been described with reference to FIG. 3, the light-emitting element and the light-receiving element are disposed so as to face each other; the optical modulation track portion of the code wheel is positioned and disposed in a gap of the photosensor module; and terminals for connection with printed wiring project from the back surface. Additionally, the photosensor module shown in FIG. 13 has positioning bosses (two pieces illustrated) projecting from the back surface.

While the photosensor module shown in FIG. 3 is of an analog type in which a signal is processed in an analog fashion at a low resolution of, for example, 50 pulses/revolution, the photosensor module shown in FIG. 13 is of a digital type in which a signal is digitally processed at a high resolution of 448 pulses/revolution. Since a digital photosensor module can correct a read signal, the digital photosensor module does not require such high accuracy in installation position as does an analog photosensor module. Thus, the digital photosensor module, which does not require high accuracy in installation position, can be positioned and disposed by use of its own positioning bosses illustrated.

Figure 14:
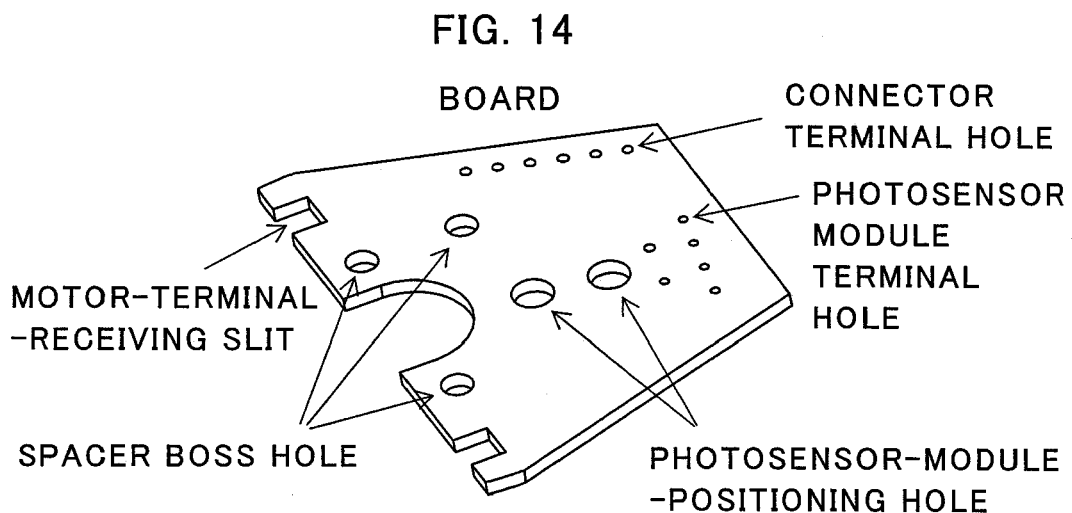
FIG. 14 is a view showing a board different from that of FIG. 5.

FIG. 14 is a view showing a board different from that of FIG. 5. As in the case of the board shown in FIG. 5, the board shown in FIG. 14 has a printed wiring portion (not shown) on its back side as well as motor-terminal-receiving slits, connector terminal holes, photosensor module terminal holes, spacer boss holes. Additionally, the board of FIG. 14 has photosensor-module-positioning holes (two pieces) at positions corresponding to the above-mentioned photosensor-module-positioning bosses.

Figure 15:
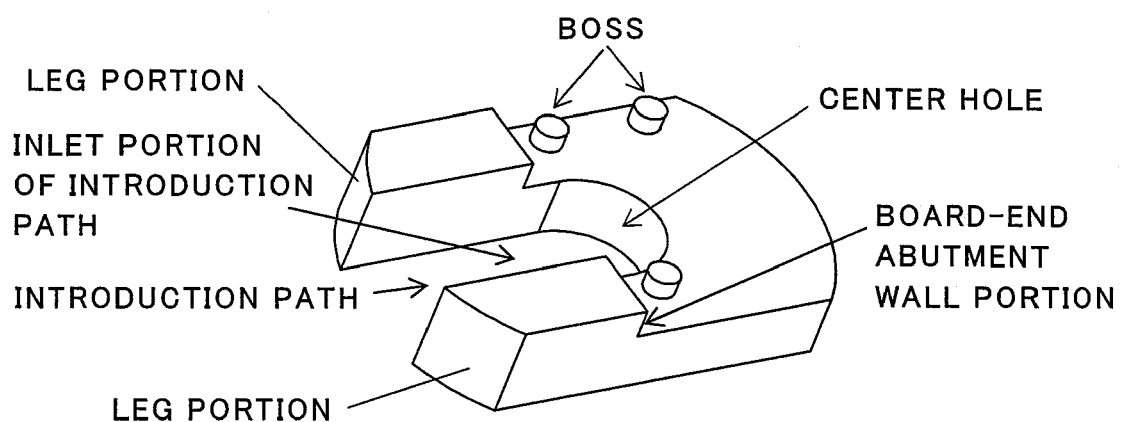
FIG. 15 is a view showing a U-shaped spacer different from that of FIG. 6.

FIG. 15 is a view showing a U-shaped spacer different from that of FIG. 6. As in the case of the spacer of FIG. 6, the spacer of FIG. 15 has the center hole which is lightly fitted to the bearing-retaining section of the motor for positioning the same, the introduction path continuous with the center hole, the leg portions located on opposite sides, respectively, of the introduction path, the board-end abutment wall portions provided on the front side thereof, and bosses (three pieces illustrated) having such a length as to extend through the corresponding spacer boss holes (FIG. 14) formed in the board. Similarly to FIG. 6, an inlet portion to the center hole of the introduction path is made slightly narrower than the outside diameter of the bearing-retaining section. However, while the U-shaped spacer shown in FIG. 6 has three engaging portions for positioning the photosensor module, the spacer shown in FIG. 15 does not have such engaging portions.

Next, the assembly of a sensor unit by use of the photosensor module having the positioning bosses as shown in FIG. 13 and the attachment of the sensor unit to the motor will be described. In assembling of the sensor unit, first, the connector terminals and the terminals and bosses of the photosensor module are inserted into the board from the front side of the board. The photosensor module is mounted and positioned on the board by use of the positioning bosses provided on the back surface of the photosensor module and the corresponding photosensor-module-positioning holes formed in the board. After the connector terminals and the terminals and bosses of the photosensor module are inserted into the board, the terminals are soldered to the printed wiring portion on the back side of the board. When the photosensor module having the bosses is mounted on the board, the photosensor module can be fixed by use of adhesive.

Next, the spacer is attached to the board from the back side of the board. In this attachment, the bosses (three pieces) of the spacer are inserted into the corresponding spacer boss holes of the board, and an end of the board is caused to abut the board-end abutment wall portions of the spacer. Subsequently, the spacer is fixed to the board by, for example, crushing ends of the bosses so as to effect hot-staking for fixing the spacer to the board, whereby the assembly of the sensor unit is completed. In this assembled state, the motor-terminal-receiving slits and the element terminal holes of the board are located externally of the spacer.

Figure 12B:
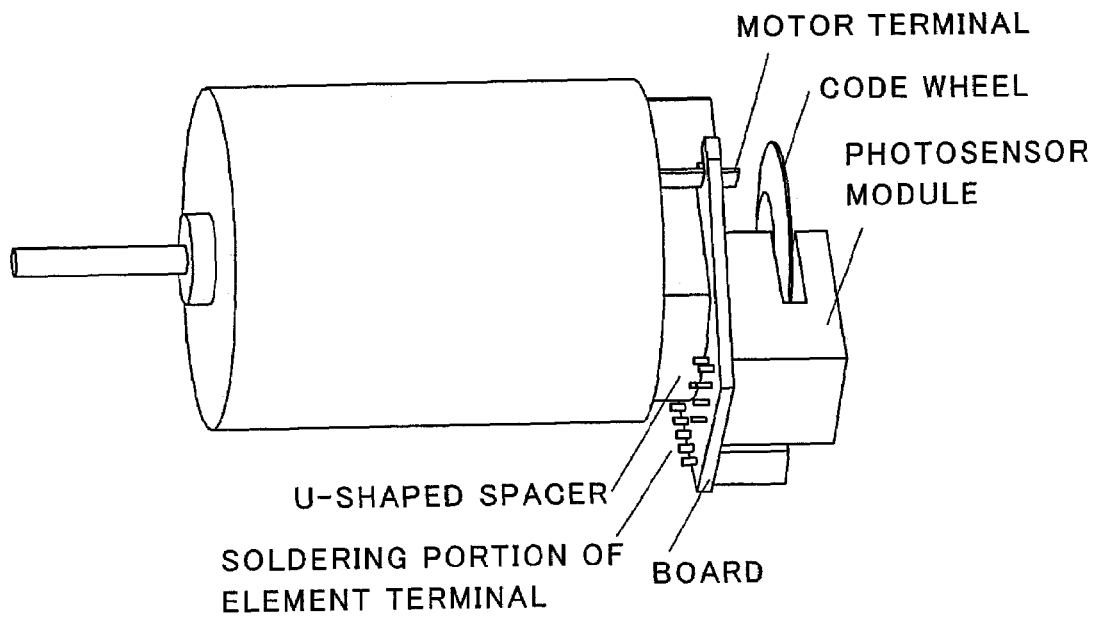

Next, the thus-completed sensor unit is attached to the motor in which the code wheel is fixed, in position, to the motor shaft. Subsequently, the motor terminals are fixed to the board by soldering. This assembling and fixing work can be carried out as in the case of the embodiment which has been described with reference to FIG. 1. In the thus-assembled motor equipped with the encoder, as shown in FIG. 12(B), the spacer has such a partially cut-out shape as to not interfere with soldering portions of element terminals and soldering portions of the motor terminals. Thus, the spacer provides wide space between the board and the motor and enables disposition of the soldering portions of terminals of elements in this space. This eliminates the need for the board to radially project a great distance from the motor; i.e., the board can be reduced in size accordingly. Therefore, the overall configuration of the motor equipped with the encoder can be reduced in size. Since the space between the board and the motor is expanded by virtue of the spacer, the motor terminals can be soldered to the board from the back side of the board. Therefore, a single-sided wiring board, which is inexpensive, can be used.

The invention claimed is:

1. An optical encoder device for a small-sized motor including a motor shaft extending to the exterior of the motor through a bearing accommodated in a bearing-retaining section provided on an end bell of the motor and paired motor terminals extending from positions on radially opposite sides of the motor shaft to the exterior of the end bell, the optical encoder device including a code wheel attached to the motor shaft and a board on which a photosensor module is mounted and which is attached to the paired motor terminals such that an optical modulation track portion of the code wheel is positioned and disposed in a gap of the photosensor module, the optical encoder device comprising:

the motor, a spacer, and the board being fixed together by soldering the paired motor terminals to a printed wiring portion of the board, while the spacer is sandwiched between the end bell and the board on which the photosensor module is mounted; and the spacer having a generally U-shaped structure having a center hole for positioning the bearing-retaining section, and an introduction path continuous to the center hole, so as to allow fitting in position thereof through the introduction path from a direction orthogonal to the motor shaft.

2. An optical encoder device for a small-sized motor according to claim 1, wherein the photosensor module is fixedly positioned by means of a positioning portion formed integrally with the spacer and extending through the board.

3. An optical encoder device for a small-sized motor according to claim 1, wherein the board is a singled-sided, printed wiring board on which a connector for external connection is mounted and which has a printed wiring portion formed on a back side thereof and to be connected to the pair of motor terminals and to the photosensor module.

4. An optical encoder device for a small-sized motor according to claim 1, wherein the spacer is lightly fitted to the bearing-retaining section, and the spacer and the board are fixed together by means of hot staking.

5. An optical encoder device for a small-sized motor according to claim 1, wherein the spacer has such a shape as to not interfere with a terminal-soldering portion of an element mounted on the board and soldering portions of the paired motor terminals.

6. An optical encoder device for a small-sized motor according to claim 1, wherein the photosensor module is fixed to the board by means of bonding with an adhesive, or a hook integrally formed with the spacer.

7. A method of producing an optical encoder device for a small-sized motor including a motor shaft extending to the exterior of the motor through a bearing accommodated in a bearing-retaining section provided on an end bell of the motor and paired motor terminals extending from positions on radially opposite sides of the motor shaft to the exterior of the end bell, the optical encoder device including a code wheel attached to the motor shaft and a board on which a photosensor module is mounted and which is attached to the paired motor terminals such that an optical modulation track portion of the code wheel is positioned and disposed in a gap of the photosensor module, the method comprising:

integrally assembling a spacer and the board carrying the photosensor module so as to form a sensor unit, the spacer having a generally U-shaped structure having a center hole for positioning the bearing-retaining section, and an introduction path continuous to the center hole, so as to allow fitting in position of the spacer through the introduction path from a direction orthogonal to the motor shaft;

fitting in position the sensor unit to the motor equipped with the code wheel from a direction orthogonal to the motor shaft; and fixing the motor, the spacer, and the board together by soldering the paired motor terminals to a printed wiring portion of the board.

\* \* \* \* \*